United States Patent [19]

Vache et al.

[11] Patent Number: 4,869,681
[45] Date of Patent: Sep. 26, 1989

[54] FRONT PLUG SYSTEM WITH LAGGING END CONTACT ARRANGEMENT

[75] Inventors: Peter Vache, Heroldsbach; Norbert Rieck, Nuremberg, both of Fed. Rep. of Germany

[73] Assignee: Siemens Aktiengesellschaft, Berlin and Munich, Fed. Rep. of Germany

[21] Appl. No.: 208,317

[22] Filed: Jun. 17, 1988

[30] Foreign Application Priority Data

Aug. 28, 1987 [DE] Fed. Rep. of Germany ....... 3728865

[51] Int. Cl.4 .............................................. H01R 4/50
[52] U.S. Cl. .................................. 439/341; 439/490; 439/924; 439/930
[58] Field of Search ............... 439/326, 341, 338, 376, 439/489, 490

[56] References Cited

U.S. PATENT DOCUMENTS

| | | | |
|---|---|---|---|
| 3,617,985 | 11/1971 | Kehl | 439/341 |
| 4,084,875 | 4/1978 | Yamamoto | 439/490 |
| 4,151,580 | 4/1979 | Struger et al. | 361/415 |
| 4,368,942 | 1/1983 | Mathe et al. | 439/676 |

FOREIGN PATENT DOCUMENTS

| | | |
|---|---|---|
| 0129883 | 6/1984 | European Pat. Off. |
| 0165434 | 5/1985 | European Pat. Off. |
| 2928668 | 2/1981 | Fed. Rep. of Germany |
| 3603643 | 8/1987 | Fed. Rep. of Germany |

*Primary Examiner*—Neil Abrams
*Assistant Examiner*—Khiem Nguyen
*Attorney, Agent, or Firm*—James G. Morrow

[57] ABSTRACT

A front plug system with a lagging end contact arrangement. The front plug system for flat components includes a front element (1) with front plug connector (20) which can be plugged on by a swinging motion. If the front plug connector is plugged on until the point of engagement of a closing arrangement (27, 15) is reached, all operating contacts of the front plug systems arranged in receiving arrangements (3, 24) are already closed. An end contact arrangement (51, 52) arranged opposite the center of rotation of the front plug connector engages only when, after operating the closing arrangement, the front plug connector is plugged completely onto the front element and secured against being pulled off. With the end contact arrangement according to the invention the electrical signals of the operating contacts can be released simultaneously in particular across a control on the flat component.

10 Claims, 4 Drawing Sheets

FRONT PLUG SYSTEM WITH LAGGING END CONTACT ARRANGEMENT

BACKGROUND OF THE INVENTION

The invention relates to a front plug system for a flat component, and more particularly to a front plug system including one front element and one front plug connector attachable to the front element with a swing motion.

Many electrical circuits are fabricated in a compact form, possibly including integrated circuits, on a flat component. In these electrical circuits, signal groups, such as data busses, are routed toward the edge of the flat component. Signals of this type can then be displayed at the front of the flat component for purposes of circuit diagnostics, indicating, monitoring and measuring. The signals may also be tapPed at the front of the flat component and, if necessary, may be redirected across additional connections. In contrast, signal groups, which constantly need to be exchanged between circuit parts disturbed over several flat components, are preferentially redirected across stationary flat ribbon cable connections on the back sides of sub-racks.

To tap and apply electrical signals on the front faces of components closely arranged in sub-racks parallel to each other, front systems are used consisting of front elements firmly connected with the particular component and a front plug connector which can be attached on the component. For example, in the European patent application having publication number 0 129 883 and application number 84 107 202.8 a front system is disclosed for components, which can be slid into sub-racks, and frame-like sub-racks to hold them. On the front strip of the particular flat component a socket for receiving a front plug is provided, with which given electrical signals can be diverted preferentially across a cable. However, such an arrangement has the disadvantage that a front plug sitting in the socket can not, or only with additional expense, be safeguarded against being unintentionally pulled off. Furthermore, in a plugging process, the contacts may make contact in an unpredictable or accidental sequence. Consequently, to avoid feedback effects on the circuit on the flat component it may become necessary before plugging takes place to briefly take this circuit completely out of operation. In the case of several components combined in a sub-rack, the entire arrangement may be taken out of operation by separating it from the power supply.

The German patent having publication number 28 50 093 further discloses a holding arrangement for circuit boards. One electrical connecting element associated with the particular circuit board is swingable from a waiting position into an operating position, in which it engages on the circuit board. This arrangement also has the disadvantage that the contacts disposed on the front face of the circuit board in the transition from the waiting position to the operating position are not closed simultaneously. In a piece of equipment, to which these tapped signals are supplied for further processing, at least transitory error functions can occur. Furthermore, in this arrangement the electrical connecting element is also not secured against being unintentionally swung into the waiting position.

SUMMARY OF THE INVENTION

An object of the invention is to provide for a front plug system including a front plug connector which can be plugged onto a front element such that when the front plug connector is plugged onto the front element, the connected signals can only be through-connected to the front plug connector after all operating contacts between the front element and front plug connector and have been connected.

Accordingly, there is provided a front plug system for a flat component comprising a front element, defining a first end and a second end, including operating contacts; a front plug connector including operating contacts, which can be plugged onto the front element with a swinging motion; and a receiving arrangement extending from the first end to the second end of the front element including a closing arrangement and an end contact arrangement at the second end of the front element. The connector further includes a supporting arrangement at the first end of the front element for hooking the front plug connector over a pivot rest. The front element and front plug connector cooperate such that a point of engagement for the closing arrangement is reached when the front plug connector and the end contact arrangement only after the front plug connector is completely plugged onto the front element.

The front plug system according to the invention has the special advantage that, due to the end contract arrangement trailing during the plug-on of the front plug connector all electrical signals for the operating contacts can be released nearly simultaneously through activation of a data latch. This is accomplished in part by means of a control arranged on the flat component and triggered by the end contact arrangement. Additionally, a reliable seating monitor for the front plug connector becomes possible, since the end contact arrangement engages only in connection with latching the front plug connector on the front element across the closing arrangement. Lastly, a further advantage of the front plug system according to the invention is that when the front plug connector is pulled out by the closing arrangement being unlatched, the end contract arrangement is disengaged before any operating contacts are interrupted. Consequently, sufficient time is available to carry out suitable safety measures. These safety measures may include triggering an alarm function and triggering data protection and terminating routines such that they can be completed before the actual interruption of the operating contacts occurs.

The invention will be explained in greater detail in conjunction with the following Figures.

FIG. 1 illustrates an advantageous design of the front plug system according to the invention including a front element with front plug connector hooked in;

FIG. 5 illustrates a part of a receiving arrangement for indicator elements, where a contact counter piece according to the invention is set in;

DESCRIPTION OF THE PREFERRED EMBODIMENT

Figure 1:
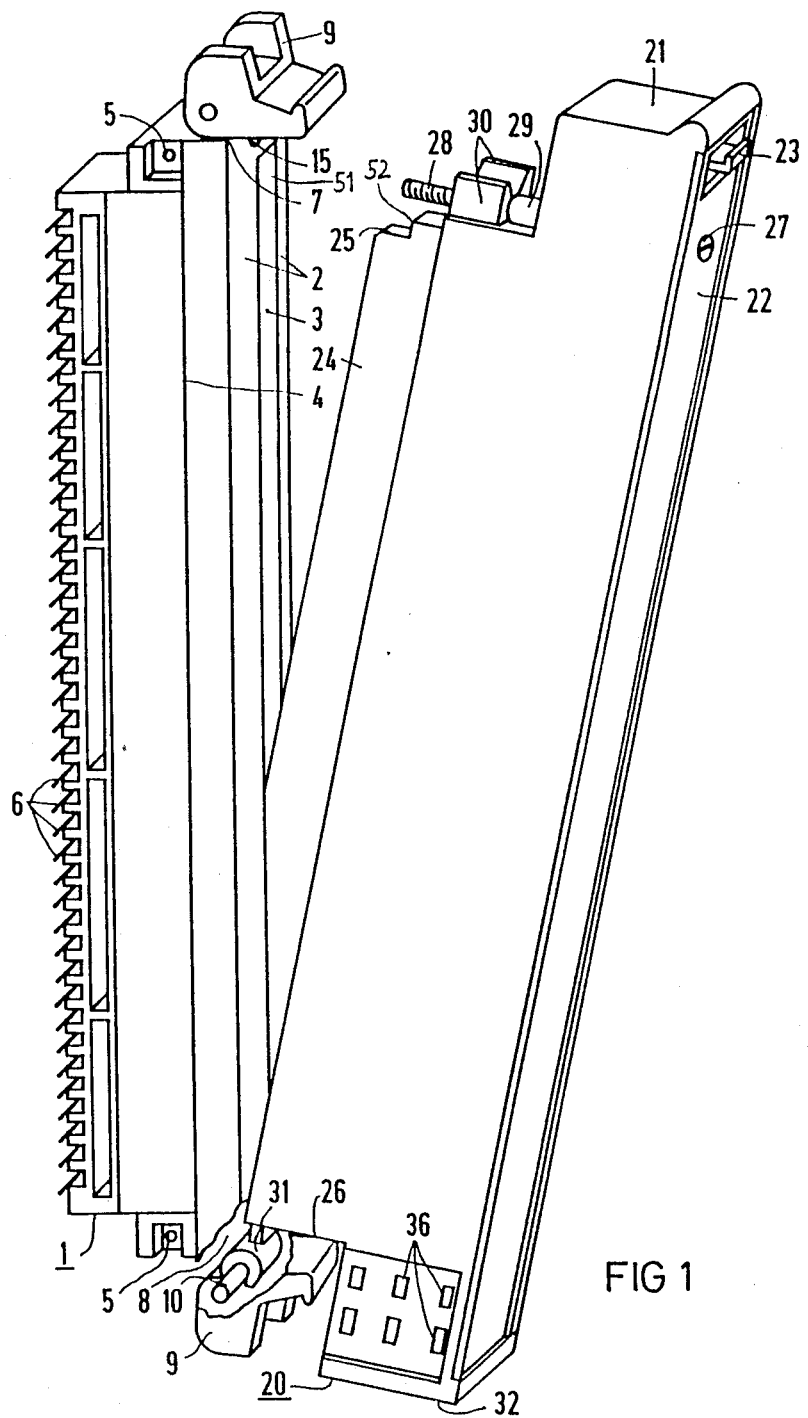

The front plug system according to the invention includes a front element 1, into which according to the representation of FIG. 1, a front plug connector 20 is hooked. The connector 20 can be hooked into a supporting arrangement by way of a pivot rest 31 provided on the lower end 26, and can be rotatably mounted there. The supporting arrangement itself consists of a bolt 10, which is arranged at the lower end 8 of the front element 1, and functions simultaneously as a bearing for one of the lifting handles 9. The front plug connector 20 can be plugged onto the front element 1 with a swing motion around bolt 10 as a center of rotation. This establishes contact between the electrical operating contacts, which are arranged in a receiving arrangement extending from one end 7 to the other end 8 of the front element 1 and from one end 25 to the other end 26 of the front plug connector 20. In the preferred embodiment, shown in FIG. 1, the receiving arrangement 3 is built on the front face 2 of the front element 1 in the form of a slit and contains preferentially the contact blades of the operating contacts. This receiving slit 3 engages the preferentially bar-shaped receiving arrangement 24 of the front plug connector 20, which contains preferentially the contact clip of the operating contacts. The support of the parts of the operating contacts in the slit 3 and the bar-shaped receiving arrangement 24 has the special advantage that in a plug-in process through a swing motion the front plug connector 20 is guided due to the mutual engagement of the two arrangements 3 and 24. In this manner, accidental tilting and, hence, the danger of damaging the operating contacts is essentially eliminated.

The front element 1 is connected mechanically through bores 5 with a flat component, which, for the sake of greater clarity, is now shown in FIG. 1. In this arrangement, contact pins 6, which are arranged on a long side of the front element 1, engage bores on the flat component and can be brought into contact there with conductor paths through a process such as soldering. In this manner, electrical signals of the circuit on the flat component can be brought "outside" and are applied on the parts of the operating contacts arranged in the receiving arrangement 3 of the front element 1. After the front pug connector is plugged in, these electrical signals can be redirected across a cable connected in its interior of the back side of the operating contacts. This can be led outside preferentially across a shaft 32 at the lower end 26 of the front plug connector 20.

According to the preferred embodiment, a last operating contact 52, distinct from the other operating contacts, is provided at the end 25 of the receiving arrangement 24 of the front plug connector 20. This operating contact 52 is preferentially set back relative to the remaining operating contacts, and is represented in the embodiment of FIG. 1 by a step at the upper end 25 of the bar-shaped receiving arrangement 24 of the front plug connector. The contact 52 is associated with, and engageable with, a contact 51 provided at the end 7 of the front element 1. The portion of this operating contact arranged opposite in the slit-shaped receiving shaft 3 of the front element 1 can be set back relative to the remaining parts.

An important feature of the preferred embodiment of the invention is that the end contact arrangement 51, 52 engages only upon operation of a closing arrangement available at the front plug system. Accordingly, the front plug connector can only be plugged on the front element by way of the swing motion until the point of engagement of the closing arrangement is reached. The closing arrangement is designed according to the invention such that in this state the receiving arrangements of front element and front plug connector have already engaged each other and all operating contacts have been closed with certainty. The completely plugged on state is only achieved through an additional operation of the closing arrangement. This overcomes the last closing path, engages the end contact arrangement, and simultaneously latches the front plug connector against being pulled off.

In the preferred embodiment of FIG. 1 the closing arrangement is arranged together with the end contact arrangement 51, 52 at the other ends 7, 25 of the front plug system. The closing arrangement includes at least one screw 27 guided through the front plug connector 20 and at least one inner thread supported opposite in the front element 1. A screw 27 shown in FIG. 1 is preferentially supported in the front plug connector by way of a holding means 30 and a screw shaft 29 with enlarged outer diameter. Plugging the front plug connector is initially only possible until the screw threads 28 stop at the inlet of the inner threads 15. The operating contacts of the receiving arrangements 3 and 24 are in this state already closed. Since the set-back arrangement of the operating contact 52 serves as an end contact arrangement 51, 52 at the upper ends 7, 25 of the front plug system, this is closed according to the embodiment only after the front plug connector 20 is completely pulled against the front element 1 by screwing the screw 27 into the inner threads 15. Through suitable choice of the length of the screwing threads 28, the delay time can be set in order to trigger safety measures between interruption of the end contact arrangement 51, 52 and the interruption of one of the operating contacts and, if possible, also be able to complete them. This delay time is advantageous for purposes of unlatching the closing arrangement.

Figure 2:
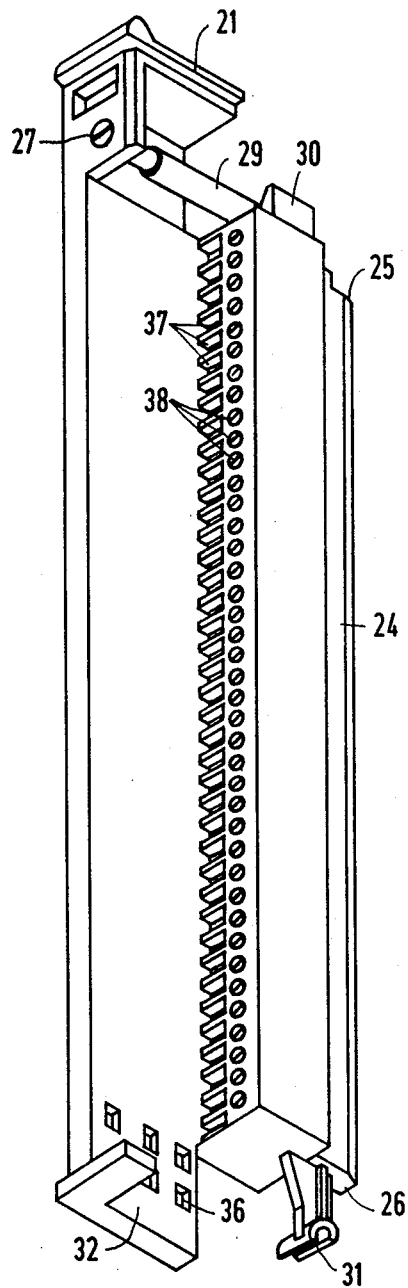
FIG. 2 illustrates a part of the front plug connector according to the design of FIG. 1.

Since the front plug connector is preferentially an aid for conducting electrical signals of the operating contacts into a cable, it is advantageous to built the front plug connector in two parts. This is already shown in the embodiment of FIG. 1. The front plug connector shown there consists of a basic body 21 and a detachable cover 22, which can be stopped preferentially with a clamping projection 23. FIG. 2 shows a possible internal structure of a front plug connector with the cover taken off. On the inner side of the basic body 21 opposing the receiving arrangement 24 for this purpose, one strip terminal 37 and one screwing strip 38 are arranged for tightening the individual binding posts. In this manner, the wires of a cable inserted by way of shaft 36, at the lower end 26 of the front plug connector can be connected to the part of the operating contacts in the receiving arrangement 24. Lastly, the cable can be fastened on the basic body 21 preferentially with cable binders, which are led through lead-throughs 36.

In another embodiment, it is possible to use the front plug connector for as a programming plug. At this end, shortcircuit connections can belayed between individual binding posts of the operating contacts. The front plug system according to the invention permits a particularly simple correction of the available connections through temporary unlatching of the closing arrangement when the end contact arrangement is disengaged. To unlatch, it is not necessary to remove the front plug connector.

Figure 3:
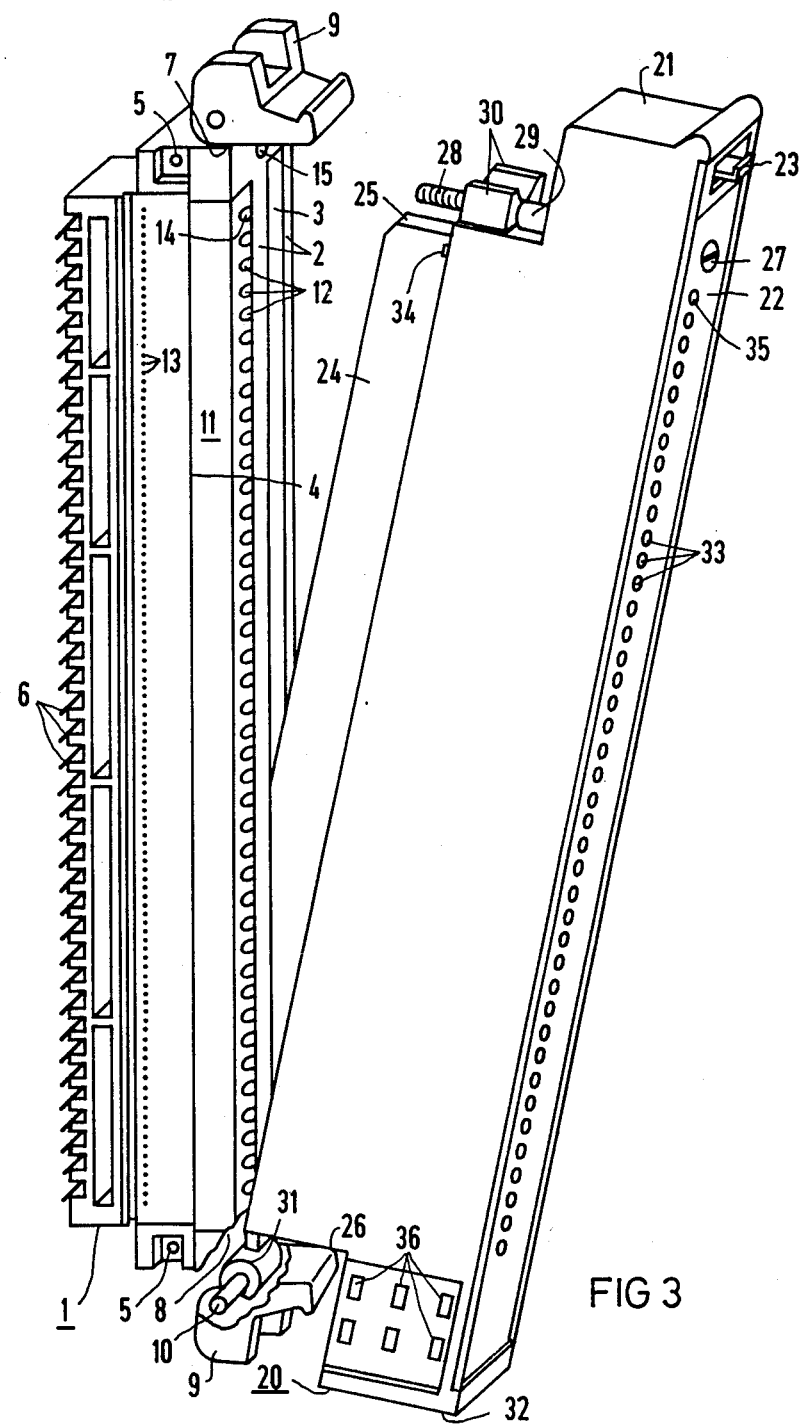
FIG. 3 illustrates a further advantageous design of the front plug system according to the invention.

Another embodiment of the end contact arrangement according to the invention is shown in FIG. 3. The front plug system contains additional indicator elements 12, which are placed in an additional receiving arrangement 11. These elements 12 are arranged parallel to the receiving arrangement 3 for the operating contacts. Light emitting diodes are particularly suitable as indicator elements 12. These diodes are inserted on the inner side of a trough strip 4 arranged on one long side of the front element. The leads of the indicator elements are led outside by means of a row of bores 13 arranged on a long edge of the trough strip 4 and can be connected there with conductor paths of the flat components. The number of indicator elements 12 corresponds preferentially to the number of operating contacts in the receiving arrangements 3 and 24, such that the active states of the signals of the electrical circuit of the flat component applied to the operating contacts can be indicated optically.

In the embodiment of FIG. 3, the front plug connector, in its attached state, projects beyond the indicator elements. In particular, with additional bores opposing the particular indicator elements in the front plug connector, the indicator elements can be made visible. It is presently preferred to set in the end contact arrangement instead of the indicator elements. All operating contacts, consequently, are available for signal transmission. Furthermore, no mechanical changes, for the receiving arrangement and the position of the operating contacts are required.

The indicator element at the upper ends 7, 25 of the front plug system is particularly advantageously replaced by the end contact arrangement. Corresponding to the representation of FIG. 3, a part of the end contact arrangement is used instead of the indicator element 14 in the front element. Opposite, an additional part of the end contact arrangement is shown on the front plug connector labeled 34.

Figure 4:
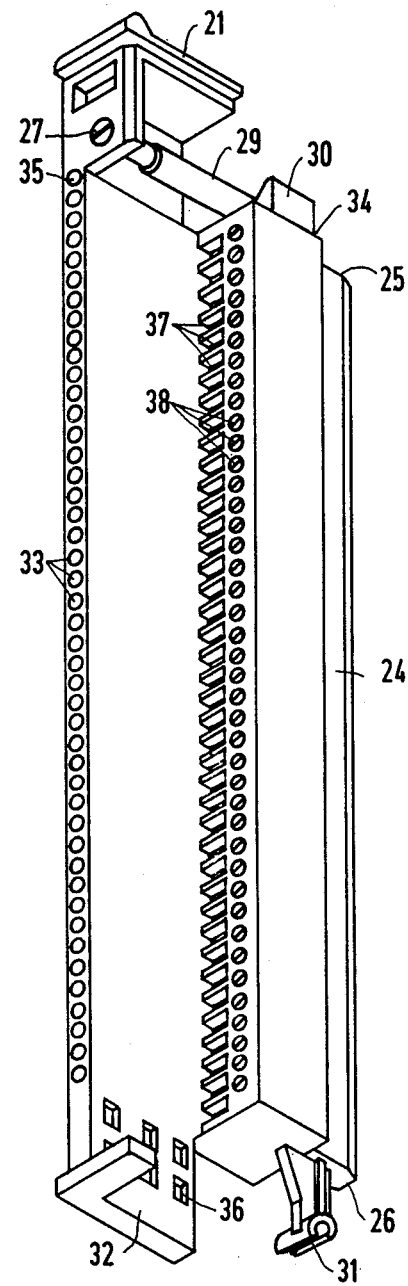
FIG. 4 illustrates a part of the front plug connector according to the design of FIG. 3.

FIG. 4 shows in a view corresponding to FIG. 2, wherein the front plug connector according to the design of FIG. 3 has the cover 22 removed. Here, the bores 33 in the basic body 21 for visualization of the individual indicator elements can be recognized.

Figure 5:
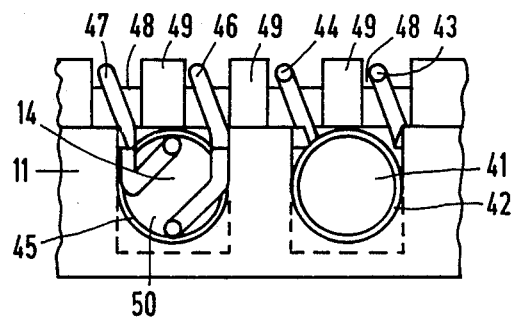
Figure 6:
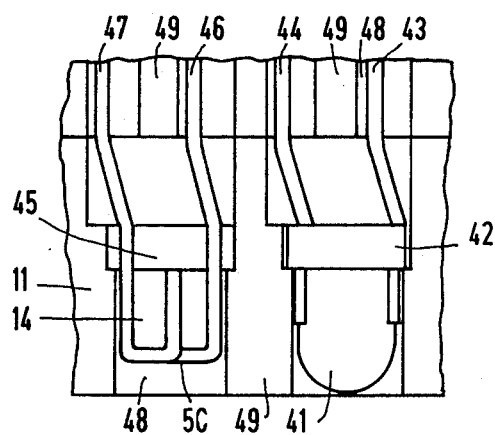
FIG. 6 illustrates a sectional representation of the part of the receiving arrangement of FIG. 5.

A particularly advantageous design for an end contact arrangement suitable in place of one of the indicator elements in FIG. 3 is shown in FIGS. 5 to 8. This consists of a contact counter piece 14 and a contact pin 39. As shown in FIGS. 5 and 6, the contact counter piece is adapted to the outer shape of one of the indicator elements. In the illustrated embodiment, the contact counter piece 14 has nearly the shape of a light emitting diode 41. Further, leads 46 and 47 are led in the same way as leads 43 and 44 of the light emitting diode 41. Thus, without great expense, it is possible to replace one of the indicator element with such contact counter piece. The detail representation of FIGS. 5 and 6 show a cutout of a possible structure of the inner side of the additional receiving arrangement 11. In particular, over troughs 48 and webs 49 arranged between them, the inner side is adapted to the shape of the indicator elements to be received. The contact counter piece 14 and their leads 43, 44, 46 and 47 are received in such a way that all inserted elements are safeguarded against a displacement such as falling out.

Figure 7:
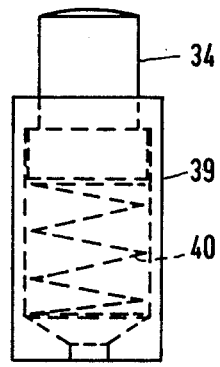
FIG. 7 illustrates a preferred embodiment of a contact pin according to the invention.

The contact counter piece 14 includes an insulating body 45 on the contact surface 50 of from which the electrical leads 46, 47 are led. The form of the piece 14 corresponds to the shape of a diode carrier 42 with inset diode glass body 41. In the state of the front plug connector, in which the latter is completely plugged on the front element, a state which can be achieved by operating the closing element, these leads are shortcircuited through a metal contact pin resting on the contact surface 50. In FIG. 7 an advantageous design of such cylindrical contact pin 39 is shown. Into it, a contact piece 34 is set braced by a spring 40, with which the actual contact is established.

Figure 8:
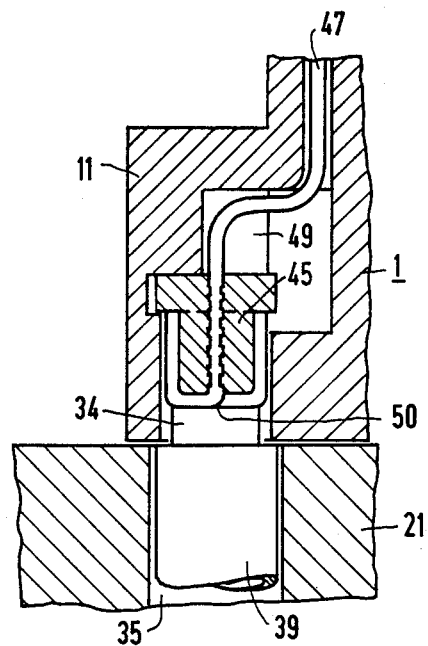
FIG. 8 illustrates sectional view through an end contact arrangement during engagement with the preferred embodiment of the contact piece and contact counter piece shown in FIGS. 5, 6, 7.

The contact pin can have an outer shape such that it can be supported in the bore 35 opposing the contact piece. The bore can function to make visible the indicator element. FIG. 8 shows such arrangement. All remaining bores 33, for making the indicator elements at the end of the particular bore more readily visible, can be filled advantageously with a lightwave guide consisting of a glass-like synthetic material.

We claim:

1. A front plug system for a flat component, defining a first end and a second end, comprising:
   a front element including electrical operating contacts and a pivot rest at the first end;
   a front plug connector, including electrical operating contacts, which can be plugged onto the front element with a swinging motion to engage the contacts of the front element, the connector further including a supporting arrangement at the first end for hooking the connector over the pivot rest at the first end of the front element;
   an end contact arrangement located at the second end of the front plug system, the end contact arrangement including a first contact means on the front element and a second contact means on the front plug connector; and
   a closing arrangement located at the second end of the front plug system, the closing arrangement including a first means for engaging located on the front element and a second means for engaging located on the front plug connector, wherein the first means engages the second means subsequent to the engagement of the electrical contacts of the front element with the electrical contacts of the front plug connector, the closing arrangement being operable such that the first contact means and the second contact means are caused to engage subsequent to the engagement of the first and second means for engaging.

2. The front plug system of claim 1, wherein
   the second means for engaging comprises at least one screw passing through the front plug connector; and
   the first means for engaging comprises opposing internal threads in the front element, wherein the screw projects from the front plug connector such that when the screw end is stopped at the inlet to the internal threads the operating contacts of the front element are engaged with the operating contacts of the front plug connector, and the first contact means and second contact means are engaged after the screw is completely screwed into the internal threads.

3. The front plug system of claim 1, wherein the first contact means is an operating contact at the second end of the front element, the first contact means being setback relative to the remaining operating contacts and engaging the second contact means only after the closing arrangement has been operated.

4. The front plug system of claim 1, further comprising an additional receiving arrangement arranged on the front element for indicator elements which is covered when the front plug connector is plugged on, the additional receiving arrangement including bores in the front plug connector, the bores being in the plugged on state opposite to the indicator elements and making them visible.

5. A front plug system for a flat component, defining a first end and a second end, comprising:
   a front element including electrical operating contacts and a pivot rest at the first end;
   a front plug connector, including electrical operating contacts, which can be plugged onto the front element with a swinging motion to engage the contacts of the front element, the connector further including a supporting arrangement at the first end for hooking the connector over the pivot rest at the first end of the front element;
   an end contact arrangement located at the second end of the front plug system, the end contact arrangement including a first contact means on the front element and a second contact means on the front plug connector;
   a closing arrangement located at the second end of the front plug system, the closing arrangement including a first means for engaging located on the front element and a second means for engaging located on the front plug connector, wherein the first means engages the second means subsequent to the engagement of the electrical contacts of the front element with the electrical contacts of the front plug connector, the closing arrangement being operable such that the first contact means and the second contact means are caused to engage subsequent to the engagement of the first and second means for engaging; and
   an additional receiving arrangement arranged on the front element for indicator elements which is covered when the front plug connector is plugged on, the additional receiving arrangement including bores in the front plug connector, the bores being in the plugged on state opposite to the indicator elements and making them visible;
   wherein the end contact arrangement includes a contact counter piece on an insulating body adapted to the shape of one of the indicator elements with electrical leads on its contact surface, and a cylindrical contact pin with an inserted elastic contact piece, with the contact counter piece being mounted on the side facing the front plug connector at the second end of the front element and with the contact pin being supported on the side facing the front element in the bore at the second end of the front plug connector.

6. The front plug system of claim 5, wherein all bores on the front plug connector, except that functioning to receive the contact pin, are filled with a lightwave guide.

7. The front plug system of claim 1, further comprising a receiving arrangement, the arrangement extending front the first to the second end and containing contact blades and contact clips of the electrical operating contacts.

8. The front plug system of claim 7, wherein the receiving arrangement comprises a slit-shaped part for the contact blades and a projecting bar-shaped part for the contact clips of the operating contact.

9. The front plug system of claim 8, wherein the front element contains the slit-shaped part and the front plug connector contains the projecting bar-shaped part of the receiving arrangement.

10. A pivoting plug system comprising:
    a front element including a first end, front operating contacts, a first means for pivoting located at the first end, a first contact means, and a first means for engaging; and
    a plug connector including a second end, plug operating contacts, a second means for pivoting located at the second end, a second contact means, and a second means for engaging;
    wherein the first means for pivoting is engageable with the second means for pivoting such that the front element is pivotable relative to the plug connector, the front operating contacts are engageable with the plug operating contacts, the first contact means is engageable with the second contact means, and the first means for engaging is engageable with the second means for engaging;
    wherein the front element is pivotable relative to the plug connector such that the front operating contacts engage the plug operating contacts before the first contact means engages the second contact means;
    wherein the first and second means for engaging are operable such that the first contact means and the second contact means are caused to engage subsequent to the engagement of the first and second means for engaging; and
    wherein the first means for engaging is engageable with the second means for engaging such that the operating contacts and the first and second contact means are held in engagement.

* * * * *